United States Patent
Wu et al.

(10) Patent No.: US 11,705,459 B2
(45) Date of Patent: Jul. 18, 2023

(54) DISPLAY DEVICE

(71) Applicant: Innolux Corporation, Miao-Li County (TW)

(72) Inventors: Yuan-Lin Wu, Miao-Li County (TW); Kuan-Feng Lee, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 17/242,308

(22) Filed: Apr. 28, 2021

(65) Prior Publication Data

US 2021/0249446 A1 Aug. 12, 2021

Related U.S. Application Data

(63) Continuation of application No. 15/451,432, filed on Mar. 7, 2017, now abandoned.

(60) Provisional application No. 62/371,252, filed on Aug. 5, 2016.

(51) Int. Cl.
*H01L 31/12* (2006.01)
*H01L 27/12* (2006.01)

(52) U.S. Cl.
CPC ........ *H01L 27/1214* (2013.01); *H01L 27/124* (2013.01); *H01L 27/1218* (2013.01); *H01L 27/1248* (2013.01)

(58) Field of Classification Search
CPC ............. H01L 27/1214; H01L 27/1218; H01L 27/124; H01L 27/1248; G09F 9/00
See application file for complete search history.

(56) References Cited

U.S. PATENT DOCUMENTS

| | | | |
|---|---|---|---|
| 2014/0306941 A1* | 10/2014 | Kim | G06F 1/1652 345/204 |
| 2016/0103534 A1* | 4/2016 | Zhang | G06F 3/0412 345/173 |
| 2016/0155788 A1 | 6/2016 | Kwon et al. | |

FOREIGN PATENT DOCUMENTS

CN 105144418 12/2015

OTHER PUBLICATIONS

"Office Action of China Related Application, Application No. 202110136359.1", dated May 26, 2022, p. 1 -p. 11.

* cited by examiner

*Primary Examiner* — Samuel Park
(74) *Attorney, Agent, or Firm* — JCIPRNET

(57) ABSTRACT

The disclosure relates to a display device which includes a substrate, pixels, a first insulating layer disposed on the substrate and including a recess, a first conductive layer disposed on the first insulating layer, a second conductive layer disposed between the first conductive layer and the substrate and electrically connected to the first conductive layer, a trace layer disposed between the first and second conductive layers and electrically connected to the first conductive layer, and a buffer layer disposed between the second conductive layer and the trace layer. The substrate includes a bent portion and a main portion and the pixels are disposed on the main portion. The first conductive layer is electrically connected to at least one of the pixels, and the first conductive layer includes a first portion disposed in the recess, and a second portion disposed out of the recess.

17 Claims, 9 Drawing Sheets

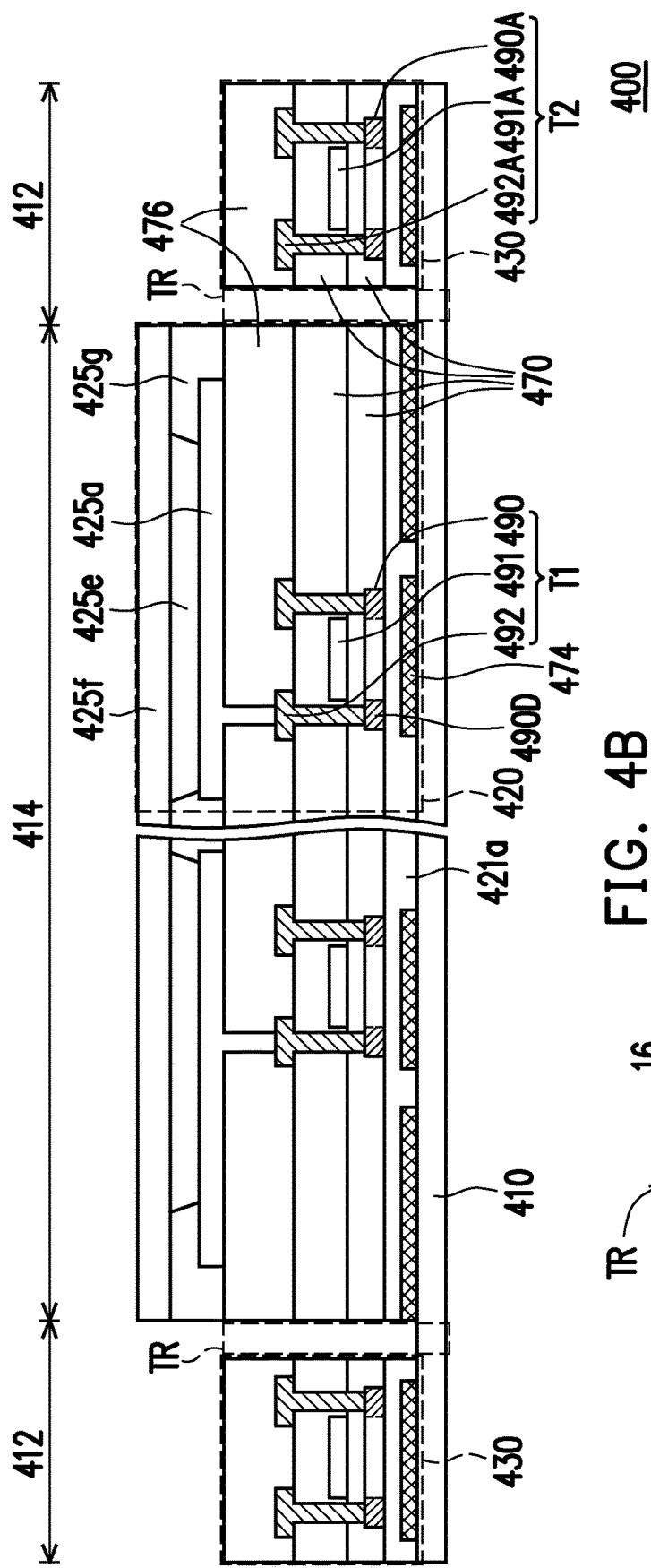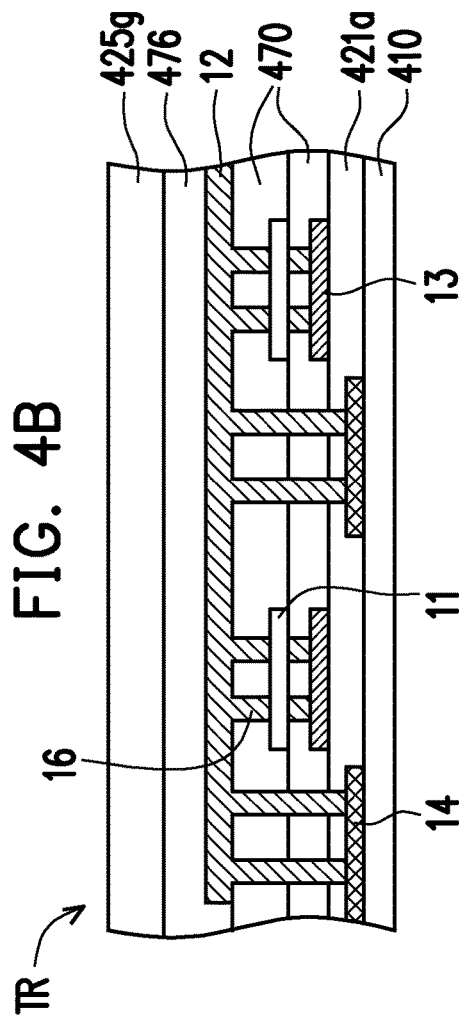
FIG. 4B
FIG. 4C

DISPLAY DEVICE

CROSS-REFERENCE TO RELATED APPLICATION

This application is a continuation application of and claims the priority benefit of a prior application Ser. No. 15/451,432, filed on Mar. 7, 2017, now pending, which claims the priority benefit of U.S. provisional application Ser. No. 62/371,252, filed on Aug. 5, 2016. The entirety of each of the above-mentioned patent application is hereby incorporated by reference herein and made a part of this specification.

TECHNICAL FIELD

The disclosure relates to a display device.

BACKGROUND

Nowadays, electronic devices such as cellular telephones, personal computers, digital cameras or other consumer electronic equipment, have gained widespread use. Such electronic devices are generally desirable for portability. In addition, among the hardware features and components of electronic devices, size of displays affects the dimensions of the electronic devices the most. Namely, size of displays is of the critical importance in designing electronic devices. With continued demand for decreased size of electronic devices, displays continue to decrease in size. As such, how to reduce the size of display borders and enhance the appearance of displays has become an issue of the industry.

SUMMARY

The disclosure provides a display device with the bent portion to reduce the border size of the display device.

A display device according to an embodiment of the disclosure includes a substrate, a plurality of pixels and an electrical circuit. The substrate has a bent portion and a main portion. The plurality of pixels is disposed on the main portion. The electrical circuit is disposed on the bent portion. At least a portion of the electrical circuit overlaps the plurality of pixels along a direction perpendicular to the main portion.

Based on the above, in the disclosure, bending the substrate where the electric circuit is formed thereon, and having at least a portion of the electrical circuit overlap the pixels along the direction may minimize the portion of the display device that can be hidden from view. In this way, it may open the possibility to various display device designs.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 4B is a schematic cross-sectional view along the line A-A of the display device in FIG. 4A before bending.

FIG. 4C is a schematic cross-sectional view of the inactive region in FIG. 4B.

DETAILED DESCRIPTION OF DISCLOSED EMBODIMENTS

Figure 1A:
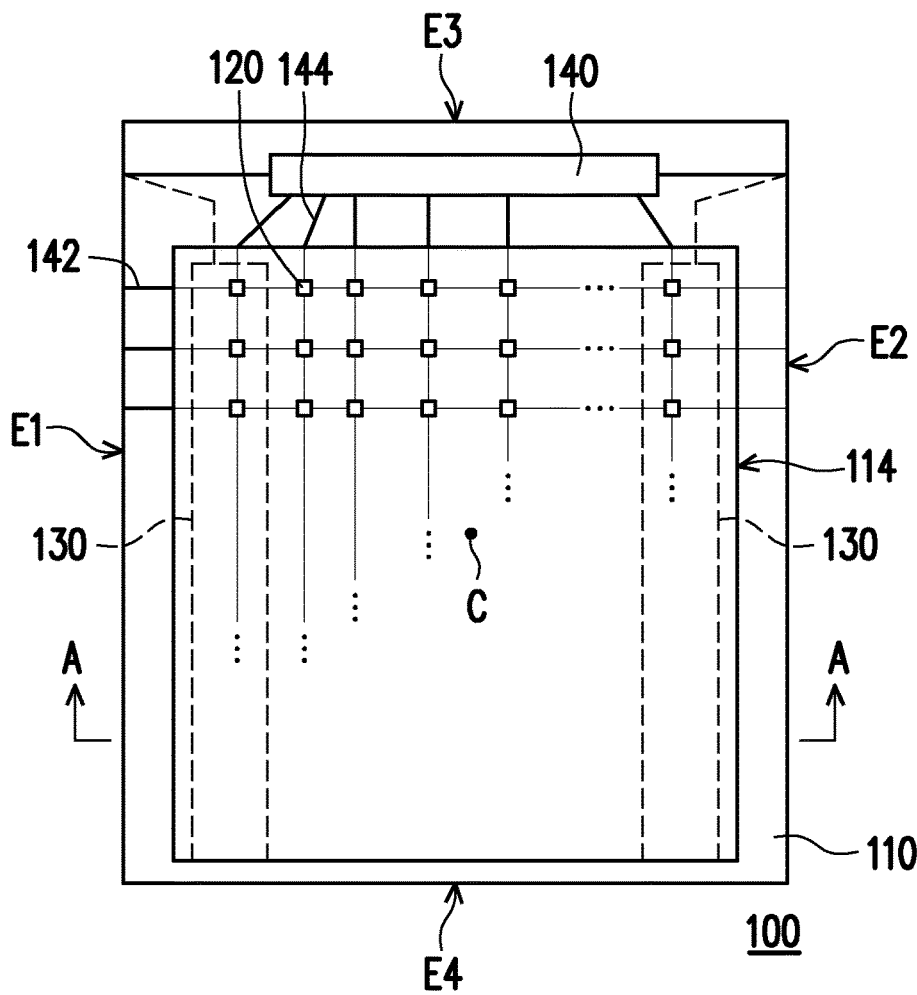
FIG. 1A is a schematic top view of a display device according to a first embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

The foregoing and other technical contents, features, and effects of the disclosure will be clearly described in the following detailed descriptions of the embodiments with reference to the accompanying drawings. The language used to describe the directions such as up, down, left, right, front, back or the like in the reference drawings is regarded in an illustrative rather than in a restrictive sense. Therefore, the directional wording is used to illustrate rather than limit the disclosure. For example, in the following descriptions, the description that a first object is on a second object covers the embodiment where the first object and the second object are in direct contact and the embodiment where the first object and the second object are not in direct contact. Besides, in the embodiment where the first object and the second object are not in direct contact, there may be another object or simply a space between the first object and the second object.

Figure 1B:
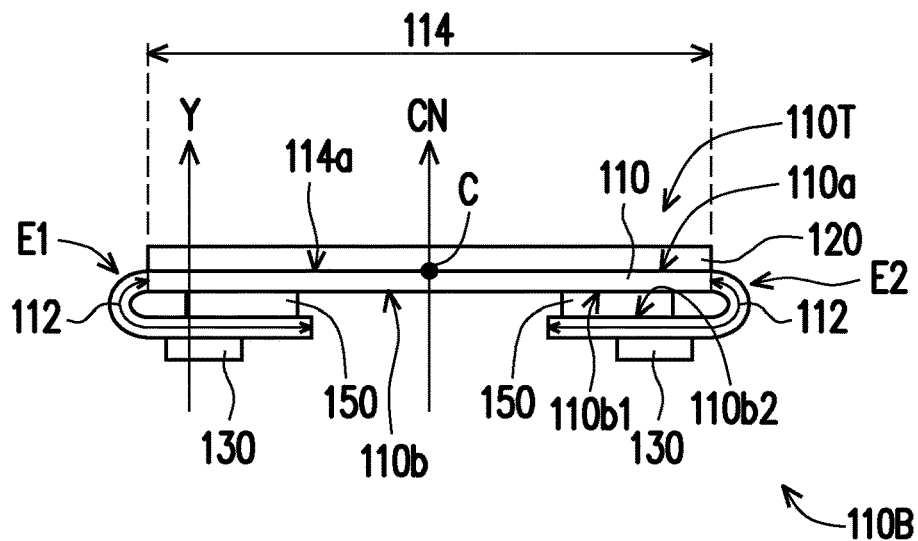
FIG. 1B is a schematic cross-sectional view along the line A-A of the display device in FIG. 1A.

FIG. 1A is a schematic top view of a display device according to a first embodiment of the disclosure, and FIG. 1B is a schematic cross-sectional view along the line A-A of the display device in FIG. 1A. Referring to FIG. 1A and FIG. 1B, the display device 100 includes a substrate 110. The substrate 110 can be a rigid substrate or a flexible substrate. In some embodiments, the substrate 110 can be of rectangular shape and can include four edge portions, E1, E2, E3, and E4. A first edge portion E1 is opposite to a second edge portion E2. A third edge portion E3 is opposite to a fourth edge portion E4 and the first edge portion E1 is next to the third edge portion E3.

In some embodiments, at least one edge portion of the substrate 110 can be bent. For example, in FIGS. 1A and 1B, the first edge portion E1 and the second edge portion E2 are bent downwardly. The portion of the substrate 110, which has been bent, for example, bent downwardly, is defined as a bent portion 112. In this embodiment, the first edge portion E1 includes one bent portion 112, and the second edge portion E2 includes one bent portion 112. The portion of the substrate 110, which has not been bent, is defined as a main portion 114. In some embodiments, the main portion 114 can be flat, as shown in FIG. 1B. However, in other embodiments, the main portion 114 can be not flat and include uneven or curved surface. In such situation, the bent portion 112 can have greater bending extent than the main portion 114.

The bending process can be conducted before the display device is presented to the consumers (or users). FIG. 1B shows the state of the display device, in which the substrate 110 has been bent. Alternatively, according to some embodiments, when a flexible substrate is used as the substrate, the bending process can be conducted by the consumer. That is, originally, the substrate of the display device can be flat, and then the consumer can bend the substrate to have the bent portion according to requirement, thus obtaining the display device as shown in FIG. 1B.

Referring to FIG. 1A and FIG. 1B, the solid lines in the figures represent that the components are located at a top side 110T of the substrate 110, while the dash lines represent that the components are located at a bottom side 110B of the substrate 110. The main portion 114 has a top surface 114a. The top surface 114a has a centroid C and a central normal direction CN to the top surface 114a at the centroid C. For example, the top surface 114a of the main portion 114 may be rectangular shape. Therefore, the centroid C lies where the diagonals of the top surface 114a of the main portion 114 intersect each other.

Moreover, the display device 100 also includes a plurality of pixels 120 and an electrical circuit 130. In FIG. 1B, for simplicity, the plurality of pixels 120 in a whole are shown as pixel layer 120. The plurality of pixels 120 is disposed on the upper surface 110a of the substrate 110. Also, the plurality of pixels 120 is disposed on the main portion 114. In some embodiments, the first edge portion E1 of the substrate 110 can be bent downwardly. That is, the first edge portion E1 can be bent from the top side 110T toward the bottom side 110B. Further, the second edge portion E2 of the substrate 110 can be bent downwardly. Thus, two bent portions 112 can be formed. In some embodiments, the electrical circuit 130 can be disposed on at least one bent portion 112.

For example, the electrical circuit 130 may be a driving circuit, for example, a gate driving circuit or a data driving circuit. When the electrical circuit 130 is formed on the substrate 110 and is a gate driving circuit, the electrical circuit 130 can be a gate driver on panel (GOP) circuit. The pixels 120 may be organic light emitting diode (OLED) pixels, micro LED pixels, quantum dot (QD) pixels, LCD pixels, or other suitable display pixels. It should be noted that other types of pixels may be used in the display device 100, which is not limited thereto.

Furthermore, at least a portion of the electrical circuit 130 overlaps the plurality of pixels 120 along the direction Y. The direction Y can be a direction perpendicular to the main portion 114. Or, the direction Y can be parallel to the central normal direction CN. In some embodiments, the direction Y can be a thickness direction. The thickness direction can be defined as the direction along which layers of the pixels 120 are formed. The layer of the pixels 120 can be any one of an insulating layer, conductive layer, active layer, gate layer, source/drain layer, etc. As such, the bent portions 112 overlap the main portion 114. In addition, the electrical circuits 130 on the bent portions 112 and the portion of the plurality of pixels 120 overlap with each other along the direction Y. In this way, at least one side of the substrate 110 is bent downwardly to hide the electrical circuits 130. Thus, the electrical circuits 130 will not occupy the front surface (upper surface) of the substrate 110, so as to decrease the non-display area (border area). Thus, in some embodiments, a narrow border or borderless display device can be obtained.

In the present embodiment, the plurality of pixels 120 can be an array of pixels and can include rows and columns of pixels for producing images. In some embodiments, the plurality of pixels 120 can be disposed on the main portion 114 of the substrate 110. In some embodiments, some pixels 120 can also be disposed on the bent portion 112.

The plurality of pixels 120 may be coupled to the electrical circuit 130 by gate lines 142, the plurality of pixels 120 may be coupled to a driver circuit 140 by data lines 144, and the electrical circuit 130 and the driver circuit 140 may be coupled to each other. As shown in FIG. 1A, the driver circuit 140 can be disposed on the same side with the pixels 120. That is, the driver circuit 140 and the pixels 120 can be formed on the top side 110T of the substrate 110. The electrical circuit 130 can be formed as an integrated circuit (IC) bonded on the substrate 110, and the driver circuit 140 can be formed as an integrated circuit (IC) bonded on the substrate 110. Alternatively, the electrical circuit 130 and the driver circuit 140 can be formed on the substrate 110, and some layers of the electrical circuit 130 and the driver circuit 140 can be formed simultaneously with some layers (such as gate layer) of the pixels 120. The electrical circuit 130 can transmit a gate signal via the gate lines 142 to operate the pixels 120. The driver circuit 140 can transmit a data signal via the data lines 144 to operate the pixels 120.

Moreover, in some embodiments, the display device 100 can further include a supporting member 150. The supporting member 150 can be disposed between the main portion 114 and the bent portion 112 of the substrate 110 along the direction Y for supporting the bent portion 112 and also preventing the bent portion 112 from over bent. In some embodiment, the supporting member 150 can be disposed between the main portion 114 and the bent portion 112 along the thickness direction. Specifically, as shown in FIG. 1B, in the bent portion 112, the lower surface 110b of the substrate 110 is bent downwardly. Thus, in the bent portion 112, the lower surface 110b1 can face to another lower surface 110b2. The supporting member 150 can be disposed between the lower surface 110b1 and another lower surface 110b2 of the substrate 110. The supporting member 150 can be made of metal or plastic, but is not limited thereto. The supporting member 150 can be of any shape, such as strip shape, or can include concave structure.

If the radius of curvature of the bent portion 112 of the substrate 110 exceeds an allowable curvature radius or an exceeding bending stress is produced at the bent portion 112, a crack may occur in the bent portion 112 or in an area adjacent to the bent portion 112, thereby causing deterioration in a display quality of the display device 100. However, disposing the supporting member 150 may prevent such crack from occurring. Furthermore, the curvature that the substrate 110 can be bent may be restrained by the thickness of the supporting member 150. For example, for the thicker supporting member 150, the bent portion 112 is bent loosely in a smaller curvature (larger radius of curvature). On the other hand, for the thinner supporting member 150, the bent portion 112 may be bent in a larger curvature (smaller radius of curvature) or even bent in circular arc.

Figure 2:
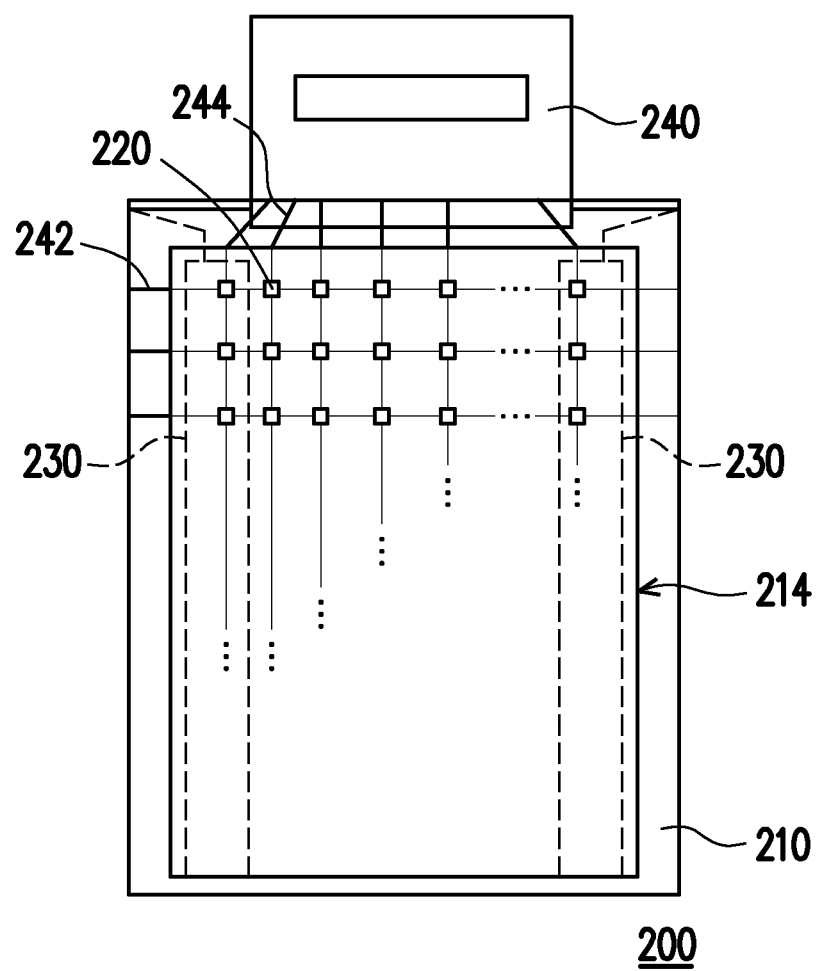
FIG. 2 is a schematic top view of a display device according to a second embodiment of the disclosure.

FIG. 2 is a schematic top view of a display device according to a second embodiment of the disclosure. Referring to FIG. 2, the display device 200 of the embodiment is similar to the display device 100 of FIG. 1A. The identical or similar numbers refer to the identical or similar elements throughout the drawings, and detail thereof is not repeated. The substrate 210 includes the main portion 214 and the bent portion (not illustrated). The electrical circuit 230 is disposed in the bent portion of the substrate 210. Gate signal can be transmitted between the pixels 220 and the electrical circuit 230 via the gate lines 242. Data signal can be transmitted between the pixels 220 and the driver circuit 240 via the data lines 244. A main difference between FIG. 2 and FIG. 1A is that the driver circuit 240 is different. The display device 200 utilizes the chip-on-film package as the driver circuit (for example, integrated circuit) 240 in accordance with the design requirements. For example, a semiconductor chip is packaged on a base film to form the chip-on-film package, and has a structure flexible for bending. In addition, part of the chip-on-film package is connected to a portion of the substrate 210. The chip-on-film package may further be bent downwards along the central normal direction for downsizing the dimension of the display device 200. FIG. 2 shows the state that the driver circuit 240 has not been bent downwardly. After the driver circuit 240 has been bent downwardly, the driver circuit 240 and the electrical circuit 230 may be both disposed at the bottom side of the substrate 210, while the pixels 220 are located at the top side of the substrate 210.

Figure 3A:
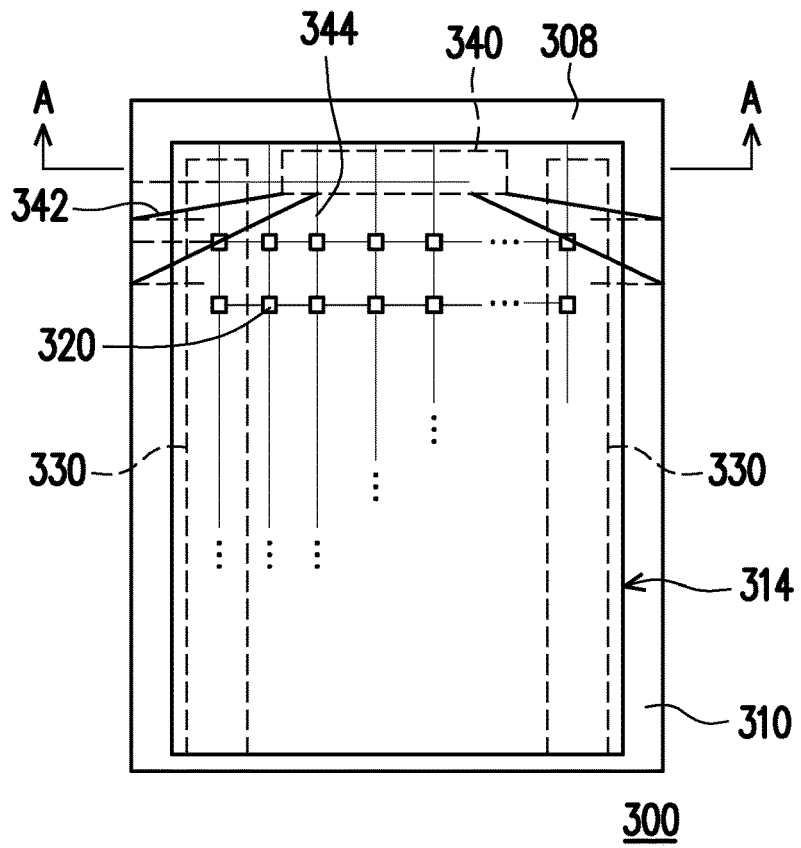
FIG. 3A is a schematic top view of a display device according to a third embodiment of the disclosure.
Figure 3B:
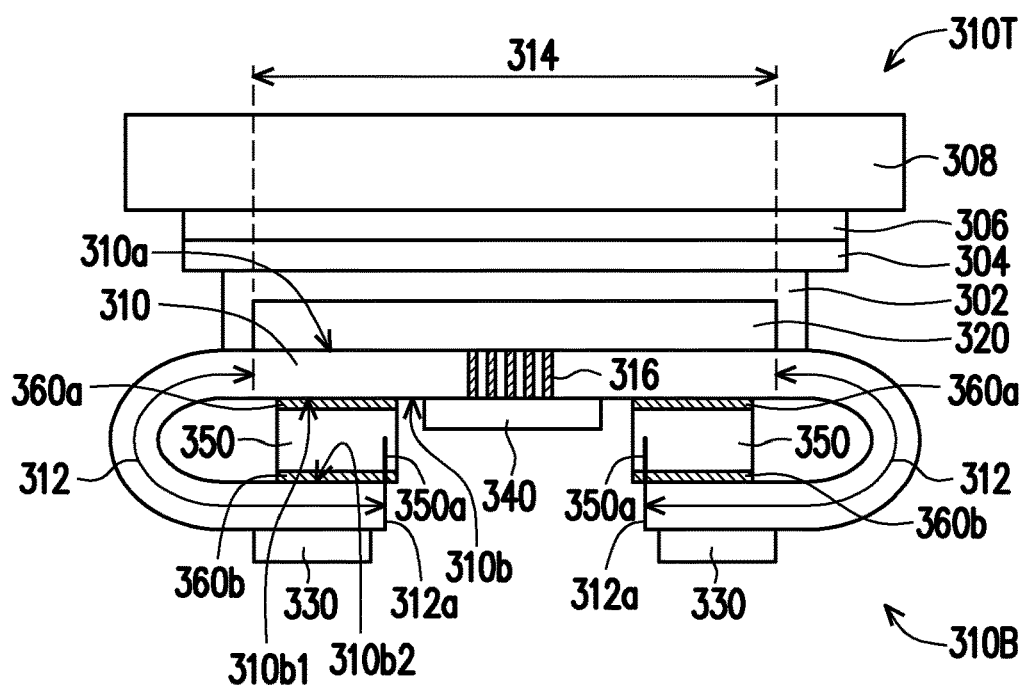
FIG. 3B is a schematic cross-sectional view along the line A-A of the display device in FIG. 3A.

FIG. 3A is a schematic top view of a display device according to a third embodiment of the disclosure, and FIG. 3B is a schematic cross-sectional view along the line A-A of the display device in FIG. 3A. Referring to FIG. 3A and FIG. 3B, the display device 300 of the embodiment is similar to the display device 100 of FIG. 1A. The identical or similar numbers refer to the identical or similar elements throughout the drawings, and detail thereof is not repeated. The substrate 310 includes the main portion 314 and the bent portion 312. The electrical circuit 330 is disposed in the bent portion 312. Gate signal can be transmitted between the pixels 320 and the electrical circuit 330 via the gate lines 342. Data signal can be transmitted between the pixels 320 and the driver circuit 340 via the data lines 344. The difference between FIG. 3B and FIG. 1B is that the driver circuit 340 is disposed on the same side with the supporting member 350. That is, the driver circuit 340 and the supporting member 350 are formed on the bottom side 310B of the substrate 310. Specifically, the driver circuit 340 is disposed on the lower surface 310b of the substrate 310. The supporting member 350 can be disposed on the lower surface 310b in a different position from the driver circuit 340 disposed.

In addition, referring to FIG. 3B, on the upper surface 310a of the substrate 310, an encapsulation layer 302, a touch sensor layer 304, a polarizer layer 306 and a cover layer 308 may be stacked in order and disposed on the pixels 320 to form the touch display device 300.

In the present embodiment, the driver circuit 340 is located at the bottom side 310B opposite to the top side 310T where the pixels 320 is disposed on. Hence, the display device 300 has a neat and compact configuration. In addition, the driver circuit 340 and the pixels 320 can be electrically connected by the vias 316. The vias 316 can be disposed in the substrate 310 and penetrate through the substrate 310. The vias 316 can provide conductive pathways from the driver circuit 340 on the lower surface 310b of the substrate 310 to the pixels 320 on the upper surface 310a of the substrate 310. It should be noted that the vias 316 may be disposed in any configuration, which is not limited in this respect. Moreover, the vias 316 may be, for example, individually formed in the substrate 310 and need not occur in groups, that is, the number of the vias 316 is also not limited thereto.

In the present embodiment, the display device 300 further includes a first adhesive 360a and a second adhesive 360b. The first adhesive 360a can be disposed on the lower surface 310b1 of the substrate 310, and the second adhesive 360b can be disposed on another lower surface 310b2. With bending of the substrate 310, the lower surface 310b1 and another lower surface 310b2 are in a face to face manner. The supporting member 350 is adhered to the substrate 310 by the first adhesive 360a and the second adhesive 360b. For instance, the first adhesive 360a is disposed between the supporting member 350 and the main portion 314, and the second adhesive 360b is disposed between the supporting member 350 and the bent portion 312. Nevertheless, the type or the shape of the first adhesive 360a and the second adhesive 360b are not limited thereto.

Furthermore, the supporting member 350 can include a first alignment mark 350a near to an edge of the bent portion 312. Thus, the edge of the bent portion 312 can be aligned with the first alignment mark 350a. In some embodiments, the first alignment mark 350a can be formed on the supporting member 350 with scale marks. By means of aligning with different scale marks, the edge of the bent portion 312 can be aligned to different predetermined positions according requirement. In addition, the first alignment mark 350a may thus be used to position the bent portion 312 of the substrate 310 so as to allow better overlay. Furthermore, in some embodiments, the bent portion 312 can include a second alignment mark 312a. During the bending process, the second alignment mark 312a and the first alignment mark 350a can be aligned with each other. With design of the positions of the first alignment mark 350a and the second alignment mark 312a, the bending extent of the bent portion 312 can be adjusted. As such, when bending the substrate 310, using the second alignment mark 312a of the bent portion 312 to align with the first alignment mark 350a of the supporting member 350 may make the products be fabricated within a specified tolerance. In other embodiments, the supporting member 350 may have multiple alignment marks 350a according to the design requirements.

Figure 4A:
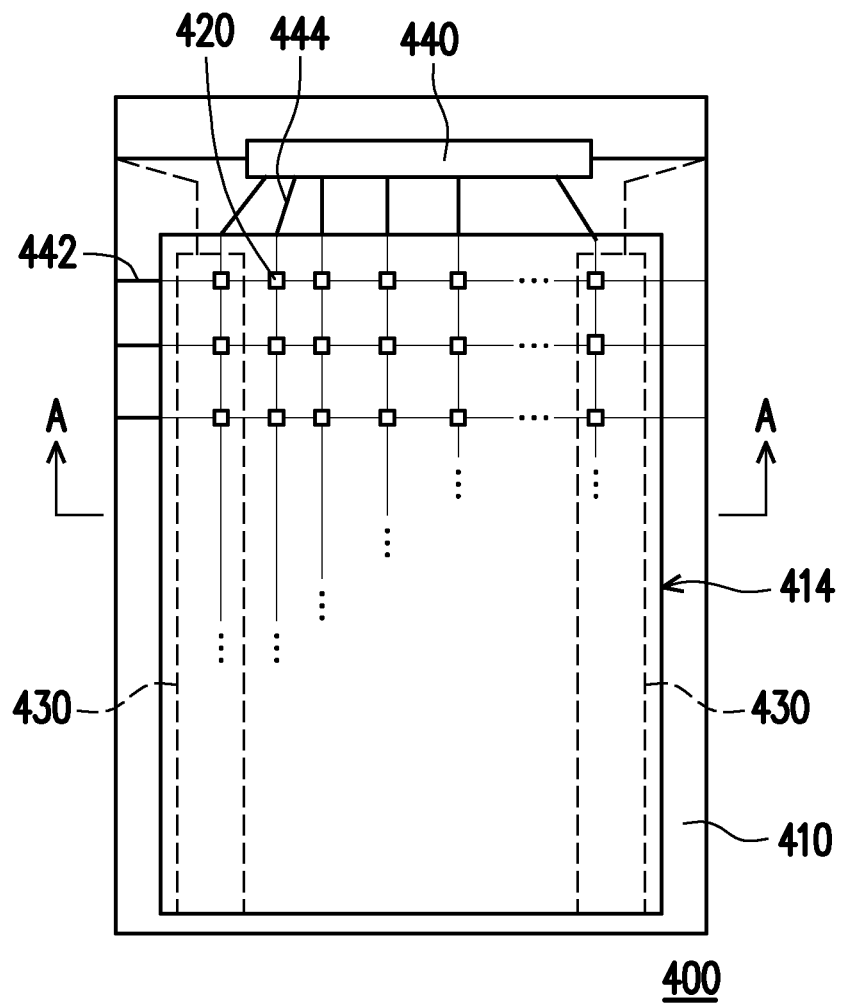
FIG. 4A is a schematic top view of a display device according to a fourth embodiment of the disclosure.

FIG. 4A is a schematic top view of a display device according to a fourth embodiment of the disclosure, FIG. 4B is a schematic cross-sectional view along the line A-A of the display device in FIG. 4A before bending, FIG. 4C is a schematic cross-sectional view of the trace region in FIG. 4B. It should be noted that the details of trace region in FIG. 4B is omitted, and the details of trace region will be presented in FIG. 4C and later embodiments. Referring to FIG. 4A to FIG. 4C, the display device 400 of the embodiment is similar to the display device 100 of FIG. 1A, and the identical or similar numbers refer to the identical or similar elements throughout the drawings. For simplicity, detailed descriptions on identical or similar elements are omitted. The substrate 410 includes the main portion 414 and the bent portion 412. The electrical circuit 430 is disposed in the bent portion 412 of the substrate 410. Gate signal can be transmitted between the pixels 420 and the electrical circuit 430 via the gate lines 442. Data signal can be transmitted between the pixels 420 and the driver circuit 440 via the data lines 444.

Furthermore, as shown in FIG. 4B, detailed elements in the pixels 420 are described. In the pixel 420, a thin film transistor (TFT) T1 is disposed on the substrate 410. The thin film transistor T1 can include an active layer 490, a gate layer 491, and a source/drain layer 492. In addition, the display device 400 further includes a first insulating layer 470, a conductive layer 474 and a second insulating layer 476. The first insulating layer 470 is disposed on the substrate 410, and the source/drain layer 492 is disposed on the first insulating layer 470. The conductive layer 474 is disposed between the source/drain layer 492 and the substrate 410, and the second insulating layer 476 is disposed on the source/drain layer 492. Moreover, at least a portion of the second insulating layer 476 overlaps the source/drain layer 492.

In the present embodiment, other layers may be formed on the substrate 410. For example, a buffer layer 421a may be formed on the substrate 410 and cover the conductive layer 474 for reducing diffusion of impurities into the other layers thereabove during the post-processing thereof. The buffer layer 421a can be formed of silicon oxide, silicon nitride or other suitable materials, which is not limited thereto. Herein, the active layer 490 can be a semiconductor layer. For instance, the active layer 490 can be formed from polysilicon or amorphous silicon. In some embodiments, the active layer 490 can be metal oxide, for example, indium gallium zinc oxide (IGZO). Portions of the active layer 490 can be doped to form a doped active region 490D for electrically connecting to the source/drain layer 492.

In some embodiment, the pixel 420 can be an OLED pixel. For example, the pixel 420 can further include a first electrode layer 425a, a light-emitting layer 425e, a second electrode layer 425f and a pixel define layer 425g. The first electrode layer 425a can be an anode, and the second electrode layer 425f can be a cathode. Alternatively, the first electrode layer 425a can be a cathode, and the second electrode layer 425f can be an anode. The pixel define layer 425g may be disposed between the second electrode layer 425f and the second insulating layer 476. The light-emitting layer 425e is disposed between the first electrode layer 425a and the second electrode layer 425f. The first electrode layer 425a can be electrically connected to the TFT T1 via the source/drain layer 492.

Furthermore, the bent portion 412 may include a trace region TR. The trace region TR can be a region located between the main portion 414 and the electrical circuit 430. The trace region TR includes trace layers for electrically connecting the pixels 420 and the electrical circuit 430. Specifically, the gate layer 491 of the pixel 420 can be electrically connected to the gate layer 491A of the thin film transistor T2 of the electrical circuit 430. In this way, gate signal can be transmitted between the pixel 420 and the electrical circuit 430.

A part of the trace region TR is shown in FIG. 4C. In the trace region TR, the electrical tracing can include a first trace layer 11, a second trace layer 12, a third trace layer 13, and a fourth trace layer 14. The first trace layer 11 can be the same layer as the gate layer 491, and the second trace layer 12 can be same layer as the source/drain layer 492. The third trace layer 13 can be the same layer as the active layer 490, and the fourth trace layer 14 can be the same layer as the conductive layer 474. It should be noted that one layer is the same layer as another layer means that one layer and another layer are formed with the same material and in the same process. Taking the first trace layer 11 and the gate layer 491 for example, a conductive layer (not shown) is formed on the substrate, and then patterned by photolithography to form the first trace layer 11 and the gate layer 491 in the same process. Furthermore, the above trace layers can be electrically connected through contact vias 16. In addition, the third trace layer 13 can be a doped semiconductor, and can be the same layer as the doped active region 490D in order to reduce resistance.

As shown in FIG. 4C, design of the multiple connections among the trace layers can reduces the possibility of short-circuit failure due to the occurrence of cracks in the bent portion 412. Further, in this manner, the overall reliability of the display device is improved. In addition, the active layer 490 in the main portion 414 shown in FIG. 4B may be formed by the same layer of the same material with the active layer 490A in the electrical circuit 430. Similarly, the gate layer 491 in the main portion 414 and the gate layer 491A in the electrical circuit 430 can be formed as the same layer. The source/drain layer 492 in the main portion 414 and the source/drain layer 492A in the electrical circuit 430 can be formed as the same layer. Hence, the process may be simplified and the production cost may also be reduced. In one embodiment, the pixel define layer 425g in the main portion 414 may extend to the trace region TR as a protection layer in order to reduce the bending stress and also make the display device easy to bend.

Figure 5:
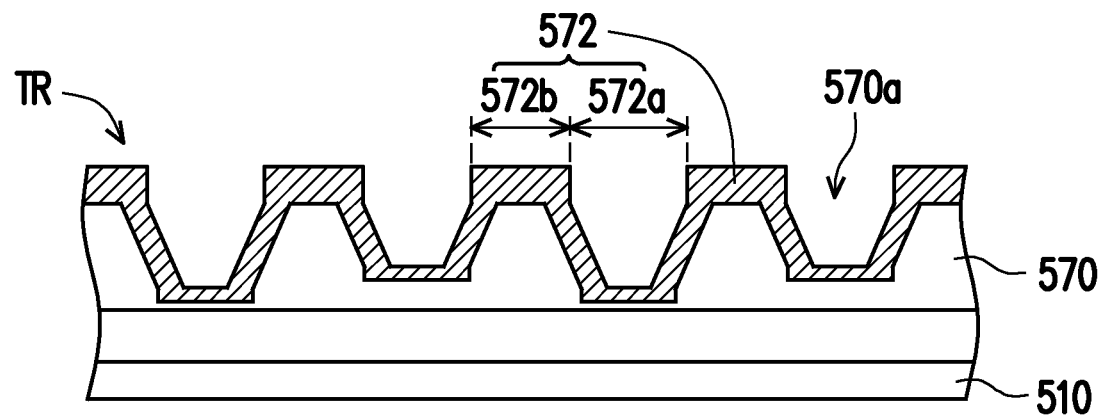
FIG. 5 and FIG. 6 are schematic cross-sectional views of the inactive region of different embodiments.
Figure 6:
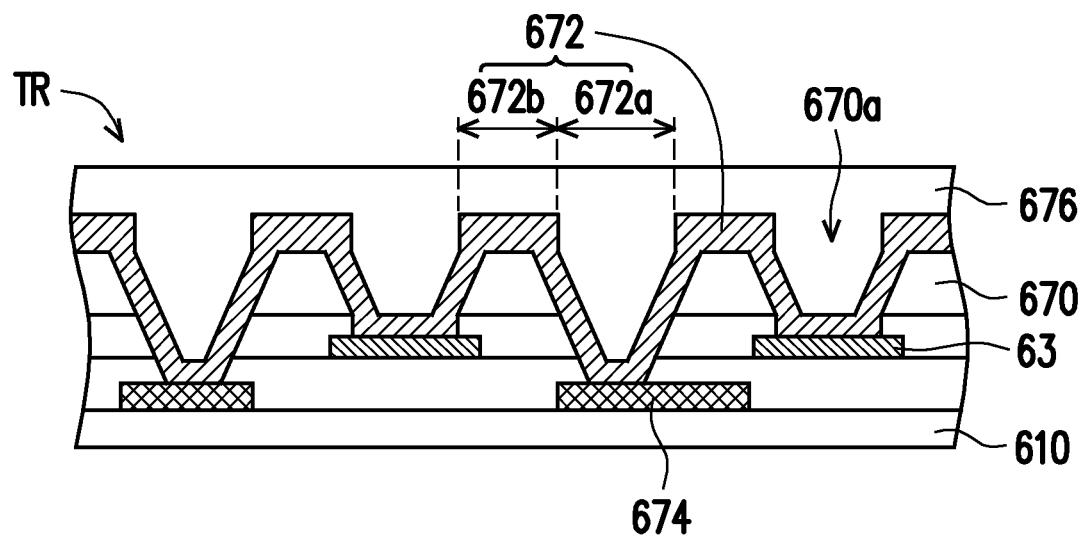

FIG. 5 and FIG. 6 are schematic cross-sectional views of the trace region TR of different embodiments of the disclosure. Referring to FIG. 5, the trace region of the embodiment in FIG. 5 is similar to the trace region TR in FIG. 4C. The differences therebetween lie in that the first insulating layer 570 on the substrate 510 has a recess 570a in the bent portion. In addition, a first conductive layer 572 can be disposed on the first insulating layer 570 and electrically connected to at least one of the plurality of pixels and the electrical circuit. The first conductive layer 572 includes a first portion 572a and a second portion 572b. For instance, the recess 570a in the top view may be strip shape, dot shape or other suitable shapes, which is not limited thereto. Moreover, the first portion 572a of the first conductive layer 572 is disposed in the recess 570a, and the second portion 572b of the first conductive layer 572 in the bent portion is disposed out of the recess 570a. The first conductive layer 572 is under tension while bending. If the first conductive layer 572 is smoothly flat before being bent, tensile stress applied to the first conductive layer 572 while being bent would be close to its fracture limit and any additional stress may exceed the limit. However, in some embodiments, the first conductive layer 572 with a concave shape (or with recess 570a) may not tend to break and further prevent fracture or distortion under tension while bending. In addition, the process of bending the display device can create stresses within the structures of the display device, for instance, bent metal traces may become stressed. However, in some embodiments, having the recess 570a in the bent portion 512 may prevent stress-induced damages such as cracks which may adversely affect the reliability of the display device. In some embodiments, the first conductive layer 572 can be the same layer as the gate layer 491 of the TFT T1 in the pixel 420. Or, in some embodiments, the first conductive layer 572 can be the same layer as the source/drain layer 492 of the TFT T1 in the pixel 420. Or, in some embodiments, the first conductive layer 572 can be the same layer as the active layer 490 of the TFT T1 in the pixel 420.

Furthermore, the design in FIG. 6 combines the design of embodiments in FIG. 4C and FIG. 5. In the embodiment of FIG. 6, the trace region TR includes a first conductive layer 672, a second conductive layer 674, and a trace layer 63. The first insulating layer 670 has a recess 670a in the bent portion. The first conductive layer 672 includes a first portion 672a and a second portion 672b. The first portion 672a is disposed in the recess 670a, and the second portion 672b is disposed out of the recess 670a. The second conductive layer 674 is disposed between the first portion 672a of the first conductive layer 672 and the substrate 610. The second conductive layer 674 is electrically connected to the first conductive layer 672 via the first portion 672a. In addition, the trace layer 63 can be electrically connected to first conductive layer 672 via the first portion 672a. In addition, the second insulating layer 676 is disposed on the first conductive layer 672 to cover the first portion 672a and the second portion 672b. At least a portion of the second insulating layer 676 overlaps the first conductive layer 672. In some embodiments, the first conductive layer 672 can be the same layer as the source/drain layer 492 of the TFT T1 in the pixel 420, and the trace layer 63 can be the same layer as the gate layer 491. Or, in some embodiments, the first conductive layer 672 can be the same layer as the gate layer 491 of the TFT T1 in the pixel 420, and the trace layer 63 can be the same layer as the active layer 490. Or, in some embodiments, the first conductive layer 672 can be the same layer as the source/drain layer 492 of the TFT T1 in the pixel 420, and the trace layer 63 can be the same layer as the active layer 490.

Figure 7A:
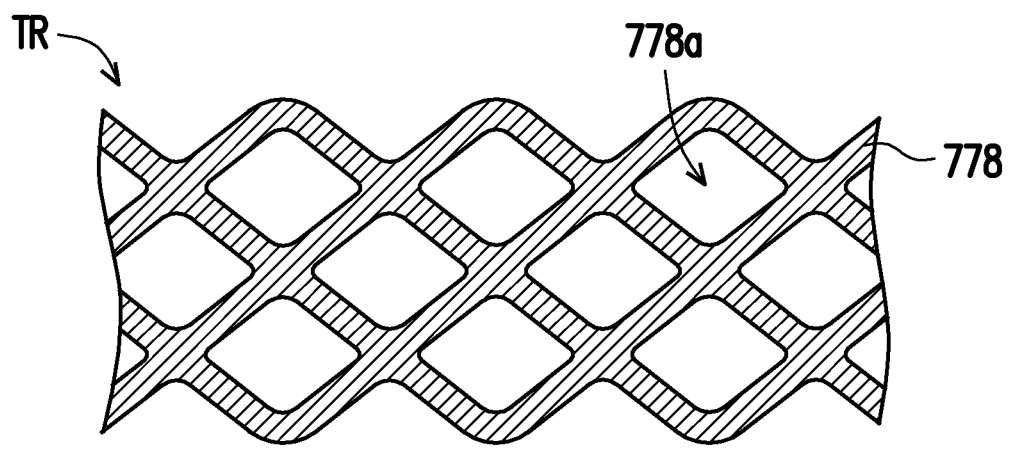
FIG. 7A is a schematic top view of the inactive region of another embodiment.
Figure 7B:
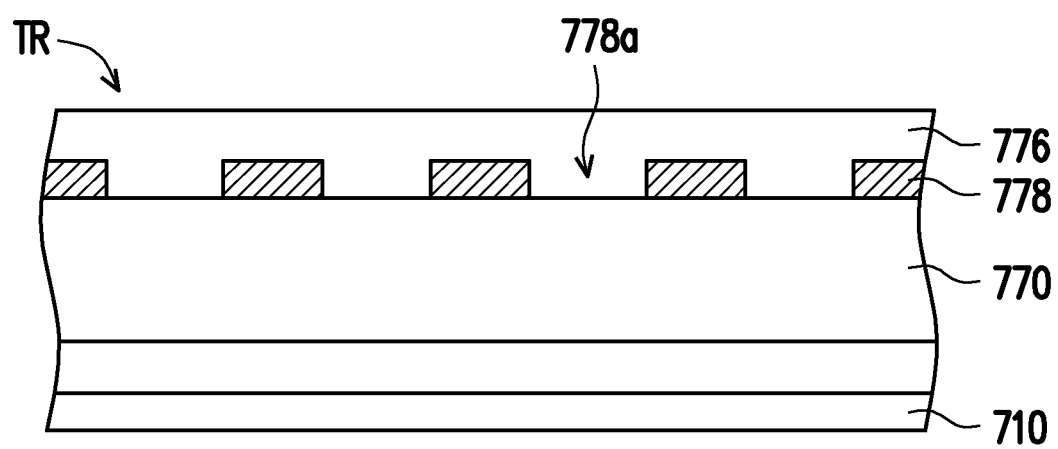
FIG. 7B is schematic cross-sectional view of the inactive region in FIG. 7A.

FIG. 7A is a schematic top view of the trace region of another embodiment of the disclosure, and FIG. 7B is a schematic cross-sectional view of the trace region in FIG. 7A. Referring to FIG. 7A and FIG. 7B, in the present embodiment, in the trace region TR, the display device can include a third conductive layer 778 and a second insulating layer 776. The third conductive layer 778 can be used as the trace layer, and can be electrically connected to at least one of the plurality of pixels 420 and the electrical circuit 430. The third conductive layer 778 is disposed on the substrate 710, and the second insulating layer 776 is disposed on the third conductive layer 778. In addition, the third conductive layer 778 can be disposed between the first insulating layer 770 and the second insulating layer 776. Moreover, at least a portion of the second insulating layer 776 overlaps the third conductive layer 778. Furthermore, in the present embodiment, the third conductive layer 778 has at least one opening 778a. The opening 778a has a profile, and at least a section of the profile is curved. For example, the profile of the opening 778a in the top view may be a polygon while any two adjacent lines of the polygon are connected with an arc. The concentration of stress generally occurs at the angles between the two adjacent lines of the opening 778a while bending. However, in some embodiments, since any two adjacent lines of the polygon are connected with an arc, the stress concentration may be avoided and also the fracture probability may be reduced while bending. A few cracks in the electric wires can cause various abnormal display issues or even make the display device not to be activated at all. In the present embodiment, the third conductive layer 778 in top view is formed into a mesh pattern to ensure the electrical connectivity steady and further prevent the display device from the cracks occurring in the bent portion and further affecting the display reliability. The third conductive layer 778 can be the same layer as the conductive layer 474, the active layer 490, the gate layer 491, the source/drain layer 492, as shown in FIG. 4B, or combinations thereof.

Figure 8:
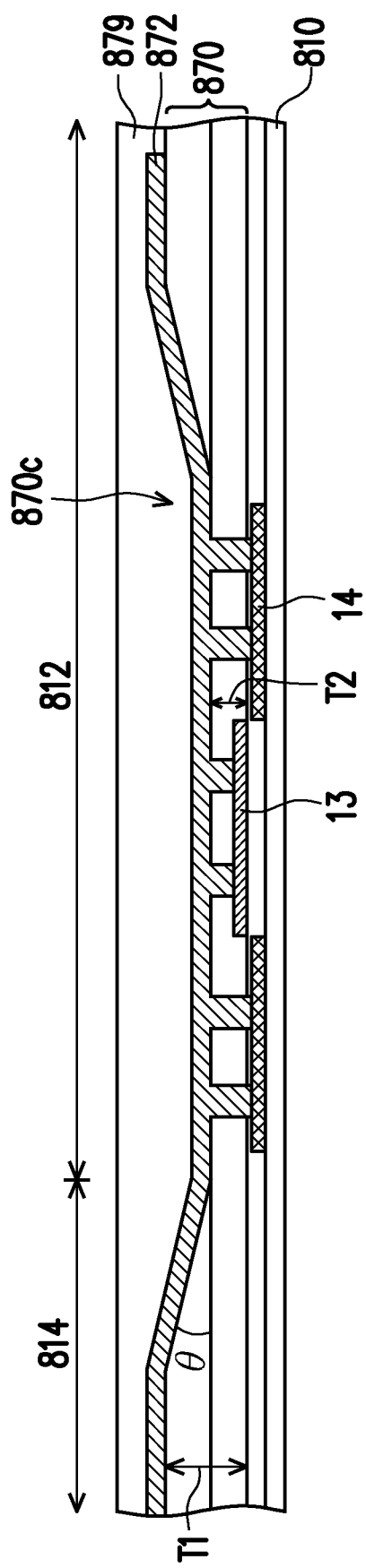
FIG. 8, FIG. 9 and FIG. 10 are schematic cross-sectional views between the main portion and the bent portion along the line A-A of the display device of different embodiments.
Figure 9:
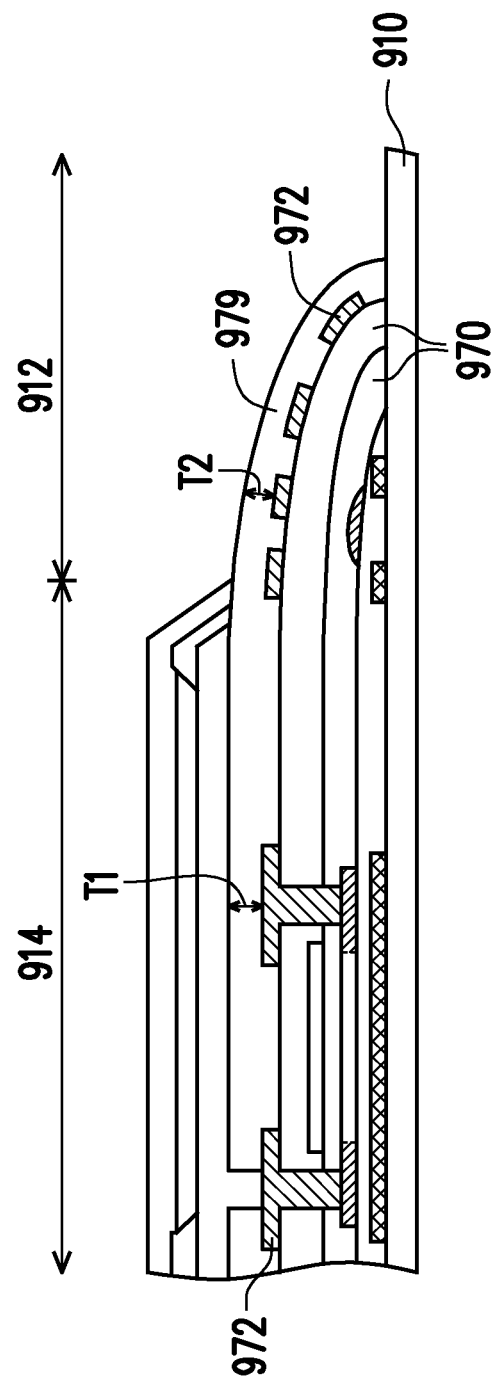
Figure 10:
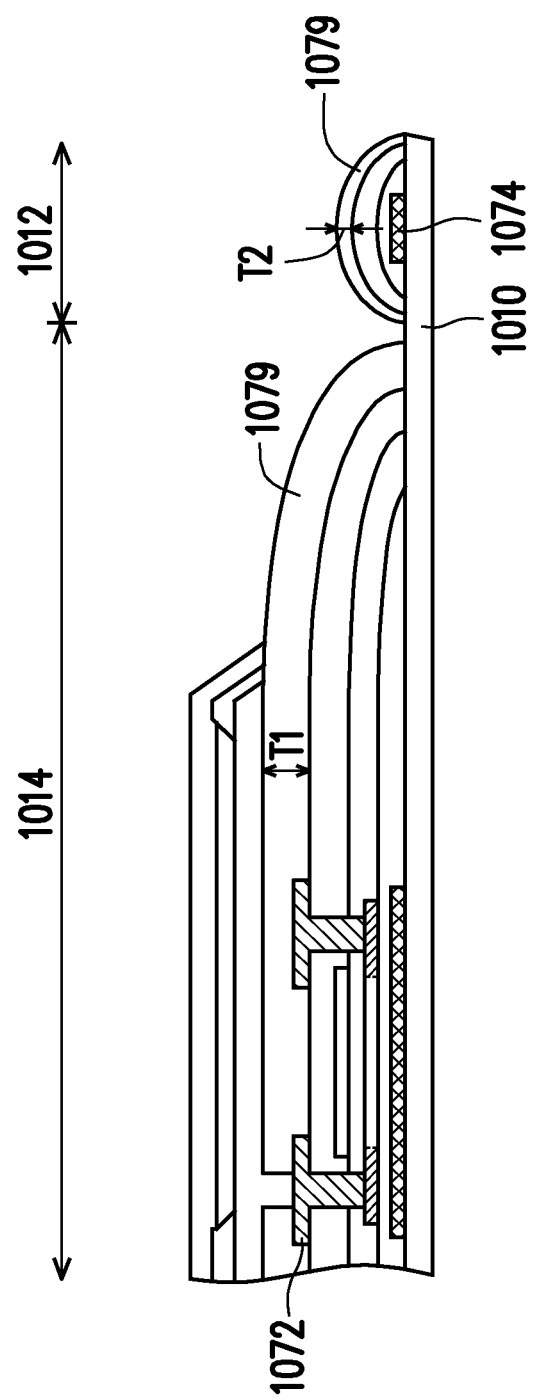

FIG. 8, FIG. 9 and FIG. 10 are schematic cross-sectional views showing the main portion and the bent portion along the line A-A of the display device 400 of FIG. 4A of different embodiments. Referring to FIG. 8, the elements of the embodiment in FIG. 8 is similar to the elements in FIG. 4B and FIG. 4C. The identical or similar numbers refer to the identical or similar elements throughout the drawings, and detail thereof is not repeated. The main difference therebetween is that the first insulating layer 870 has different thickness in the main portion 814 and in the bent portion 812.

Referring to FIG. 4B and FIG. 8, the electrical tracing in the bent portion 812 can include a first conductive layer 872 (serving as the trace layer), a third trace layer 13, and a fourth trace layer 14. The first conductive layer 872 can be same layer as the source/drain layer 492. The third trace layer 13 can be the same layer as the active layer 490, and the fourth trace layer 14 can be the same layer as the conductive layer 474. Or, in some embodiments, the first conductive layer 872 can be the same layer as the gate layer 491 or the active layer 490 in TFT T1 of the pixel 420.

The third insulating layer 879 is disposed on the substrate 810 and extends over the main portion 814 and the bent portion 812. The first insulating layer 870 can be formed by using a halftone mask to form a concave portion 870c in the bent portion 812. The first insulating layer 870 can be disposed below the first conductive layer 872 and can be between the first conductive layer 872 and the fourth trace layer 14. Thus, the first insulating layer 870 below the first conductive layer 872 can have different thicknesses in the main portion 814 and in the bent portion 812. For example, the first insulating layer 870 corresponding to the main portion 814 has a first thickness T1, the first insulating layer 870 corresponding to the bent portion 812 has a second thickness T2, and the first thickness T1 is greater than the second thickness T2. In this way, in some embodiments, since the insulating layer below the trace layer in the bent portion 812 is made thinner, cracks occurring in the bent portion 812 can be alleviated or eliminated. In addition, with the different thickness of the first insulating layer 870, the first conductive layer 872 can be formed with a taper angle θ in the main portion 814 near to the bent portion 812. The taper angle θ can be an included angle between the first conductive layer 872 and the surface parallel to the main portion 814 of the substrate 810. The range of the taper angle θ may be 20 degree to 80 degree. Alternatively, it may range from 45 degree to 60 degree depending on the design requirements. In addition, the distance between the first conductive layer 872 and the substrate 810 is reduced in the bent portion 812. As a result, the tensile stress as well as the tensile strain of the first conductive layer 872 may decrease, so that the first conductive layer 872 may not tend to break. The first conductive layer 872 can be the same layer as the source/drain layer 492, the gate layer 491 or the active layer 490 in TFT T1 of the pixel 420.

Referring to FIG. 9, the main difference between FIG. 9 and FIG. 4B is that the third insulating layer 979 corresponding to the main portion 914 has a first thickness T1, and the third insulating layer 979 corresponding to the bent portion 912 has a second thickness T2. The third insulating layer 979 can be disposed on the first conductive layer 972. The first thickness T1 is greater than the second thickness T2. The first thickness T1 and the second thickness T2 of the third insulating layer 979 are the shortest distances which may be measured from the top surface of the first conductive layer 972 to the top surface of the third insulating layer 979 in the main portion 914 and the bent portion 912, respectively. That is to say, the insulating layer 979 in the bent portion 912 is etched leaving a tapered edge, while the insulating layer 979 still protects the first conductive layer 972 in the bent portion 912. In addition, the difference between FIG. 8 and FIG. 9 lies in that the thickness of the first insulating layer 970 decreases gradually from the main portion 914 to the bent portion 912. In one embodiment, the first insulating layer 970 and the third insulating layer 979 may be fully reduced to none in the bent portion 912. Due to the decreasing thicknesses of the third insulating layer 979 and the first insulating layer 970, the distance between the first conductive layer 972 and the substrate 910 is also decreasing from the main portion 914 to the bent portion 912. As such, the tensile stress as well as the tensile strain of first conductive layer 972 may be decreased so as to prevent occurrence of cracks. The first conductive layer 972 can be the same layer as the conductive layer 474, the active layer 490, the gate layer 491, or the source/drain layer 492.

The identical or similar numbers refer to the identical or similar elements throughout FIG. 9 and FIG. 10, and detail thereof is not repeated. The first thickness T1 of the third insulating layer 1079 corresponding to the main portion 1014 can be greater than the second thickness T2 of the third insulating layer 1079 corresponding to the bent portion 1012. The main difference between FIG. 9 and FIG. 10 lies in that a portion of the insulating layer 1079 in the bent portion 1012 is removed. For example, as shown in FIG. 10, the insulating layer 1079 is only disposed in the region where the trace layer 1074 is located in the bent portion 1012, while the insulating layer 1079 in other regions of the bent portion 1012 may be etched. That is to say, the insulating layer 1079 covers the trace layer 1074 in the bent portion 1012 as a protection layer. In one embodiment, the trace layer 1074 in the bent portion 1012 can be the same layer as the first conductive layer 1072 (source/drain layer) in the main portion 1014. For instance, in the cross-sectional view, the surface of the insulating layer 1079 may be an arc shape. As such, the overall thickness of the bent portion 1012 may be reduced for decreasing the bending stress of the substrate 1010 and further lowering the fracture probability in the bent portion 1012. The trace layer 1074 can be the same layer as the conductive layer 474, the active layer 490, the gate layer 491, or the source/drain layer 492.

In view of the foregoing, in the display device according to the embodiments of the disclosure, the electrical circuit is disposed in the bent portion of the substrate to be hidden on the bottom side. Thus, narrow border or borderless display can be obtained. According to some embodiments, multiple trace layers are used in the bent portion, thus alleviating or preventing cracks in the bent portion.

It will be apparent to those skilled in the art that various modifications and variations can be made to the structure of the disclosure without departing from the scope or spirit of the disclosure. In view of the foregoing, it is intended that the disclosure covers modifications and variations of the disclosure provided they fall within the scope of the following claims and their equivalents.

What is claimed is:

1. A display device, comprising:
   a substrate, comprising a bent portion and a main portion;
   a plurality of pixels, disposed on the main portion;
   a first insulating layer, disposed on the substrate, wherein the first insulating layer comprises a recess;
   a first conductive layer, disposed on the first insulating layer, wherein the first conductive layer is electrically connected to at least one of the plurality of pixels, the first conductive layer comprises a first portion and a second portion, the first portion of the first conductive layer is disposed in the recess, and the second portion of the first conductive layer is disposed out of the recess;
   a second conductive layer, disposed between the first portion of the first conductive layer and the substrate, wherein the second conductive layer is electrically connected to the first conductive layer;
   a trace layer, disposed between the first conductive layer and the second conductive layer, wherein the trace layer is electrically connected to the first conductive layer; and
   a buffer layer, disposed between the second conductive layer and the trace layer,
   wherein the plurality of pixels comprise:
      an active layer, disposed on the buffer layer;
      a gate layer, overlapping the active layer; and
      a source/drain layer, electrically connected to the active layer.

2. The display device as claimed in claim 1, further comprising:
   an electrical circuit, disposed adjacent to a first edge of the substrate in a top view.

3. The display device as claimed in claim 2, wherein the electrical circuit is a driving circuit.

4. The display device as claimed in claim 2, further comprising:
   a driver circuit, disposed adjacent to a second edge of the substrate in the top view, wherein the second edge is perpendicular to the first edge in the top view.

5. The display device as claimed in claim 4, wherein the driver circuit is electrically connected to the electrical circuit and the plurality of pixels.

6. The display device as claimed in claim 1, further comprising:
   a second insulating layer, disposed on the first conductive layer, wherein at least a portion of the second insulating layer overlaps the first conductive layer.

7. The display device as claimed in claim 1, further comprising:
   a supporting member, disposed between the main portion and the bent portion along a direction perpendicular to the main portion.

8. The display device as claimed in claim 7, wherein the supporting member has a first alignment mark.

9. The display device as claimed in claim 8, wherein the bent portion of the substrate has a second alignment mark, and the second alignment mark corresponds to the first alignment mark.

10. The display device as claimed in claim 7, further comprising:
    a first adhesive, disposed between the supporting member and the main portion; and
    a second adhesive, disposed between the supporting member and the bent portion.

11. The display device as claimed in claim 1, wherein the trace layer and the second conductive layer are offset from one another along a direction.

12. The display device as claimed in claim 1, wherein the buffer layer partially overlaps the second conductive layer.

13. A display device, comprising:
    a substrate, having a main portion and a trace region; a first insulating layer; a first conductive layer; a second conductive layer; a trace layer; a buffer layer, wherein:
    the first insulating layer is disposed on the substrate and comprises a plurality of recesses;
    the first conductive layer is disposed on the first insulating layer and comprises first portions disposed in the recesses, and second portions disposed out of the plurality of recesses;
    the second conductive layer is disposed between the first portions of the first conductive layer and the substrate, wherein the second conductive layer is electrically connected to the first conductive layer;

the trace layer is disposed between the first conductive layer and the second conductive layer, wherein the trace layer is electrically connected to the first conductive layer; and the buffer layer is disposed between the second conductive layer and the trace layer;

a plurality of pixels, disposed on the main portion of the substrate; and an electrical circuit, disposed on the substrate, wherein the first conductive layer is electrically connected to at least one of the plurality of pixels and the electrical circuit, wherein the plurality of pixels comprise:

an active layer, disposed on the buffer layer;

a gate layer, overlapping the active layer; and a source/drain layer, electrically connected to the active layer.

14. The display device as claimed in claim 13, further comprising:

a driver circuit, disposed on the substrate and electrically connected to the electrical circuit.

15. The display device as claimed in claim 13, wherein a segment of the first portion of the first conductive layer connected to the second conductive layer extends further than another segment of the first portion of the first conductive layer connected to the trace layer.

16. The display device as claimed in claim 13, wherein the trace layer and the second conductive layer are offset from one another along a direction.

17. The display device as claimed in claim 13, wherein the buffer layer partially overlaps the second conductive layer.

* * * * *